US010734358B2

(12) United States Patent
Rosch et al.

(10) Patent No.: US 10,734,358 B2
(45) Date of Patent: Aug. 4, 2020

(54) MULTI-PACKAGING FOR SINGLE-SOCKETING

(71) Applicant: Intel Corporation, Santa Clara, CA (US)

(72) Inventors: Jonathan L. Rosch, Mesa, AZ (US); Amruthavalli Pallavi Alur, Tempe, AZ (US); Arun Chandrasekhar, Bangalore (IN); Shawna M. Liff, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/008,457

(22) Filed: Jun. 14, 2018

(65) Prior Publication Data

US 2019/0385979 A1    Dec. 19, 2019

(51) Int. Cl.
| | | |
|---|---|---|
| *H01L 23/34* | (2006.01) | |
| *H01L 25/065* | (2006.01) | |
| *H01L 23/492* | (2006.01) | |
| *H01L 25/10* | (2006.01) | |
| *H01L 23/538* | (2006.01) | |
| *H01L 23/00* | (2006.01) | |
| *H01L 23/495* | (2006.01) | |

(52) U.S. Cl.
CPC ........ *H01L 25/0657* (2013.01); *H01L 23/492* (2013.01); *H01L 23/49541* (2013.01); *H01L 23/5386* (2013.01); *H01L 23/5389* (2013.01); *H01L 24/96* (2013.01); *H01L 24/97* (2013.01); *H01L 25/105* (2013.01); *H01L 2224/04105* (2013.01); *H01L 2225/1029* (2013.01); *H01L 2225/1058* (2013.01)

(58) Field of Classification Search
CPC ..... H01L 2224/0401; H01L 2224/0001; H01L 23/49811; H01L 23/49816; H01L 25/0753; H01L 24/97; H01L 2225/06527; H01L 23/4093; H01L 2224/49113
USPC ........ 257/696, 697, 686, 777, 723, 724, 787
See application file for complete search history.

(56) References Cited

U.S. PATENT DOCUMENTS

| | | | | |
|---|---|---|---|---|
| 5,227,664 A | * | 7/1993 | Toshio | .................... H01L 23/50 257/685 |
| 5,754,408 A | * | 5/1998 | Derouiche | ............ H01L 25/105 361/773 |
| 6,094,355 A | * | 7/2000 | Vakilian | ................. H05K 1/182 174/250 |

(Continued)

*Primary Examiner* — S. V. Clark
(74) *Attorney, Agent, or Firm* — Schwegman Lundberg & Woessner, P.A.

(57) ABSTRACT

Processes for configuring a plurality of independent die packages for socketing. The packages are attached to a carrier wafer with a release film. The attached plurality of independent die packages are overmolded to provide a molded multi-die package. The molded multi-die package is planarized to expose the dies, singulated, and released from the carrier wafer. The singulated, molded multi-die packaging may be picked for further processing and placed into a socket. A plurality of molded, multi-die packages may be placed in a socket and operate as a computer system. The independent die packages may each perform and same computer application function or different computer application functions, and may have the same or different dimensions. The socket may have any of a number of configurations as may be needed.

27 Claims, 8 Drawing Sheets

(56) References Cited

U.S. PATENT DOCUMENTS

| | | | | |
|---|---|---|---|---|
| 6,169,325 B1* | 1/2001 | Azuma | ............... | H01L 25/105 |
| | | | | 257/685 |
| 2008/0094086 A1* | 4/2008 | Kim | .................. | G01R 1/0483 |
| | | | | 324/756.02 |
| 2016/0181169 A1* | 6/2016 | Huang | .................. | H01L 23/13 |
| | | | | 257/772 |
| 2017/0161223 A1* | 6/2017 | Song | ................ | H01L 23/3128 |
| 2017/0294410 A1* | 10/2017 | Haba | ............... | H01L 25/0657 |
| 2017/0323667 A1* | 11/2017 | Sun | ..................... | G11C 5/063 |

* cited by examiner

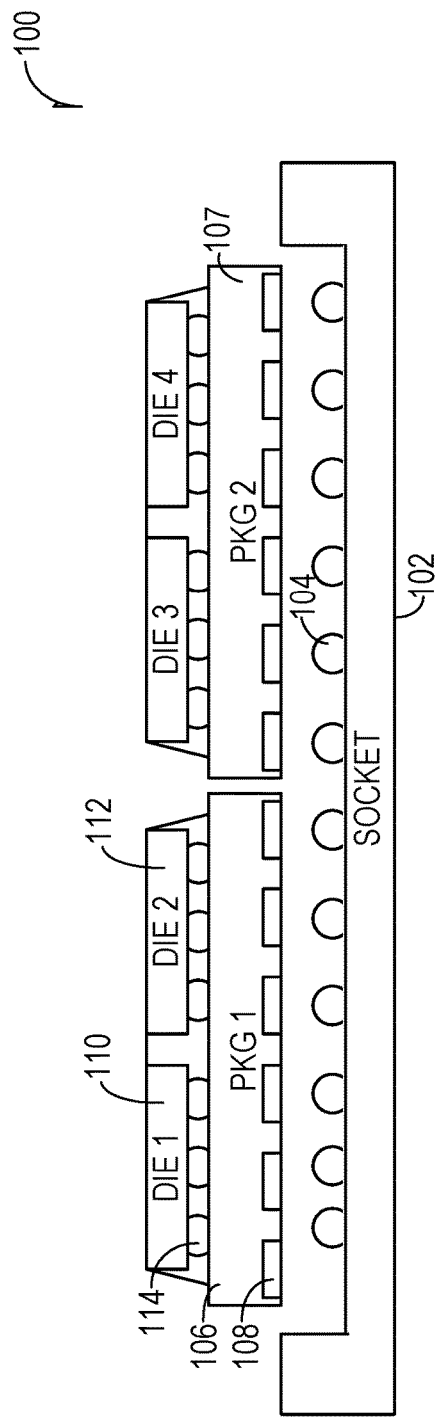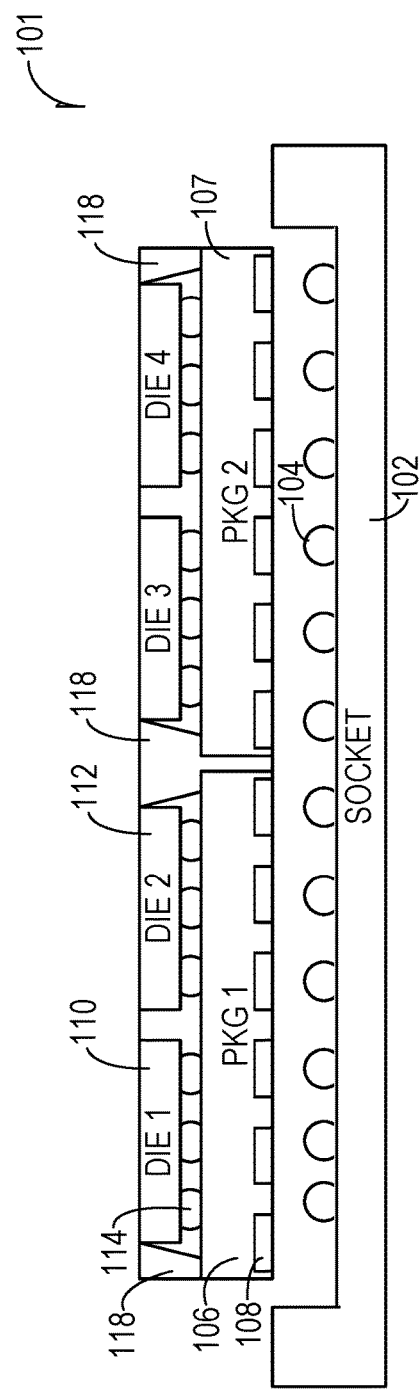
FIG.1A
FIG.1B

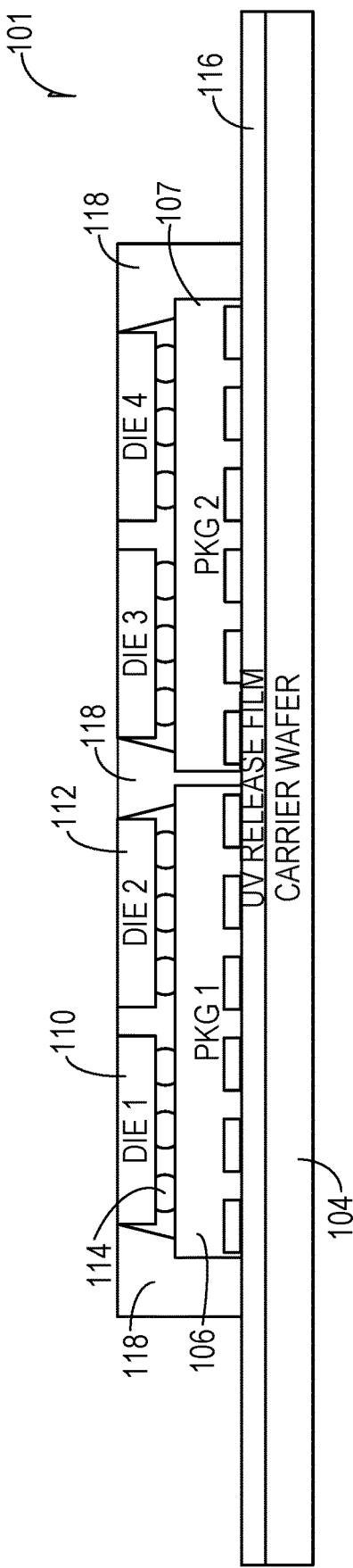
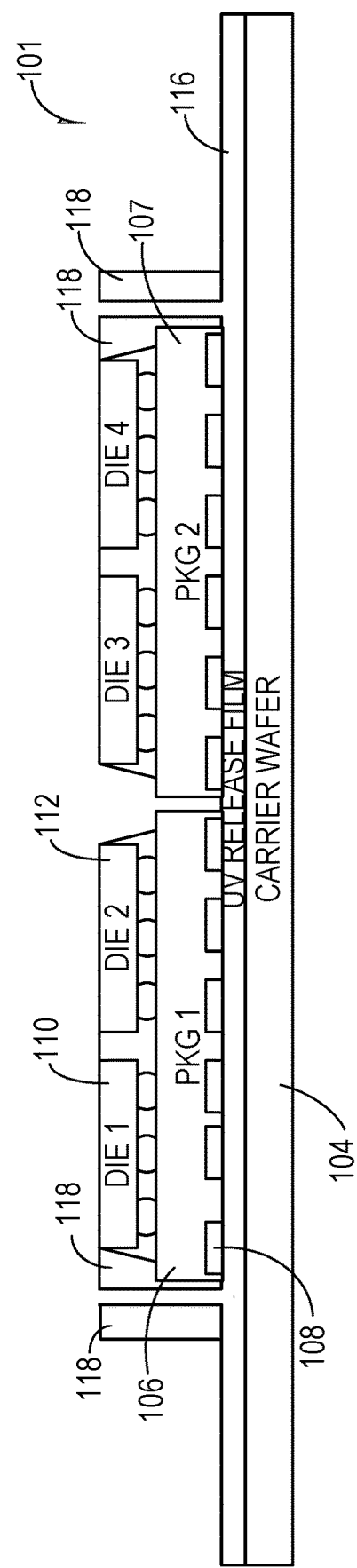
FIG. 3A
FIG. 3B

MULTI-PACKAGING FOR SINGLE-SOCKETING

TECHNICAL FIELD

The disclosure herein relates to molding multiple independent semiconductor die packages into a combined package that can then be incorporated into a semiconductor component socket.

BACKGROUND

In semiconductor component, sockets are often used to connect and secure electronic packages that include processors onto a system board (e.g., a mother board, interposer or a printed circuit board (PCB)). Most sockets are typically constructed for easy installation and replacement of the electronic packages. Many sockets include contacts that are assembled within the socket to provide an electrical connection between the system board and the electronic package that includes the processor, in some embodiments. For certain applications there has been considerable demand for customized semiconductor die packages that are compatible with existing socketing hardware. One such application uses two independent semiconductor die packages connected within a single socket. Some applications use more than two independent semiconductor die packages connected within a single socket. Current solutions have been to build larger packages with multiple dies. However, larger packages result in more warpage, lower yield, higher cost, and thermal and other reliability issues. Consequently there is a need for an improved process for implementing multiple independent semiconductor die packages for connection within a single socket.

BRIEF DESCRIPTION OF THE DRAWINGS

FIG. 1A illustrates attaching a plurality of die packages separately into a single socket.

FIG. 1B illustrates multiple independent die packages combined and placed in a single socket, according to some embodiments.

FIG. 3A illustrates a planarization step for die exposure for subsequent thermal considerations, according to some embodiments.

FIG. 3B illustrates a singulation step, according to some embodiments.

DETAILED DESCRIPTION

Figure 2A:
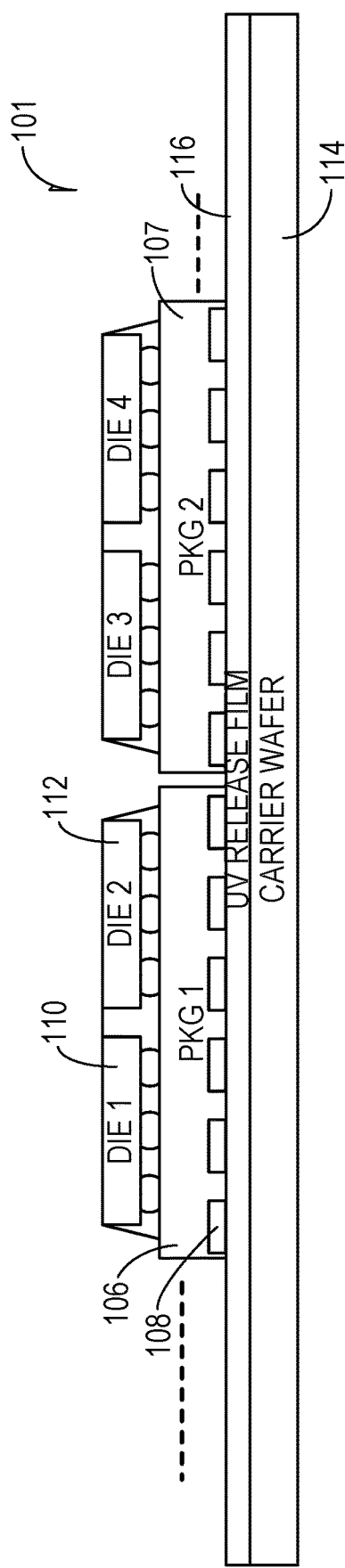
FIG. 2A illustrates independent die packages being attached to a carrier wafer with an ultraviolet (UV) release film, according to some embodiments.

For certain applications, there is demand to customize packaging solutions for compatibility with existing socketing hardware. One such application uses two independent packages connected within a single socket. Current solutions would be either to attach each package separately into a single socket (illustrated in FIG. 1A, discussed below), or to have individual sockets for each package. The disclosed subject matter, however, describes a process to combine multiple independent packages such that a single socket can accommodate multiple independent packages (one embodiment of which being illustrated in FIG. 1B, discussed below) by packaging the dies individually. This is sometime referred to as "stitching." The objective is to combine multiple independent die packages into a single package for inclusion into a single socket.

FIG. 1A illustrates at 100 attaching a plurality of packages 106, 107, each including two dies, DIE 1-DIE 2, DIE3-DIE4, separately into a single socket. This is not the desired package since there are two individual packages 106, 107, connected to the socket, which can lead to the shortcomings of warpage, lower yield, higher cost, and thermal and other reliability issues discussed briefly above, especially as the number of independent die packages increase. FIG. 1B, on the other hand, illustrates at 101 multiple independent die packages 106, 107 molded together and placed in a single socket, according to some embodiments. Embodiments of the type illustrated in FIG. 1B are desirable inasmuch as they combine multiple independent die packages such that a single socket can accommodate multiple independent packages. The number of dies are the same in each embodiment, namely, each embodiment (FIG. 1A and FIG. 1B) includes four dies. However, the embodiment of FIG. 1B is desirable because it comprises one combined package of four dies for incorporation into socket 102. FIGS. 1A and 1B are essentially the same except that FIG. 1B represents the combined packages after the process described below has resulted in the desired package, with mold 118 indicating how the packages have been combined, also as discussed below.

In FIG. 1B, socket 102 can metal or elastomer, or any other type of socket. Elements 104 represent a plurality of conductive connection points, such as ball grid array (BGA), in the socket. In some embodiments a copper core or solder core may be used for connection points to keep the height variation to a minimum. In some embodiments, a land grid array (LGA) may be used for connection. In other embodiments, a pin grid array (PGA) may be used for connection. A BGA, as illustrated in FIG. 1B, has solder balls that attach the die package interconnects by a small amount of solder heated, melted and connected to the socket. Thereafter the combination of package and socket is fixed and not designed to be removable by a customer. Component 104 could also be connections that are typical of land grid array (LGA) sockets. An LGA comprises recessed pockets with a metallic interface, for example rectangular copper connections, pressed on a conductive ball and held in place with a frame type of fixture with, in some embodiments, spring physical force to maintain the LGA connected to the socket. In other words, an LGA is generally held down by a clamp type of force, giving it the flexibility of being removed and reinstalled as the design may require. While an LGA provides a flexible, removable unit, an LGA generally has a restricted number of conductive interconnects. This is appropriate for applications such as personal computers where there are not a lot of interconnects. On the other hand, while a BGA is physically without the flexibility of removal and installation because it is soldered, it provides a much higher number of interconnections compared to an LGA. Thus BGA connections usually find use in mobile devices or servers, where once the package is installed it is nearly permanent. But it provides the benefit of a higher number of interconnects as may be needed for mobile devices and servers.

Packages 106, 107 are designated PKG1, PKG2, respectively, in FIG. 1B. PKG 1 comprises dies 110 and 112, designated Die 1, Die 2. PKG2 likewise comprises Die 3 and Die 4. Interconnect pads 108 may be used for signal, ground (GND) and power connections to the board below (i.e., the termination of traces or via stacks). Solder interconnects 114 are between the dies and the package, which again send the signals, GND and power between the package 106, 107 and the dies. Connection between die and package is made with molten balls of solder between the die and the package at interconnect points. A molten solder ball tends to be spherical but as pressure is placed on it, the top and bottom flattened out and the edges of solder ball tends to bow outwards as seen at 114, which is the natural physics of the solder.

The disclosed subject matter is not limited to pairs of dies combined in a package. Any number of dies can be used in a package, or in a molded, combined package, depending on the needs addressed by an embodiment. Further, the die packages in the molded multi-die package can be of the same computer application function or different computer application functions. For example, if packages, each of a different computer application function, are used in a design, there is today no solution to combine the different types of packages into a single socket form factor. However, in the disclosed molded multi-die package, there can be different types of packages, each with a different computer application function, combined for inclusion into a single socket. This is accomplished by the disclosed subject matter by using a molding technique to provide a single package device with customizable applications. In some embodiments, dies with different computer application functions, such as central processing unit (CPU), graphics, modem, transceiver, antenna and Wi-Fi computer application functions, or combinations of the foregoing, can be combined in a single multi-die package for inclusion into a single socket. The socket may be customized for inclusion of the combined package, compared with today's solution of embedding dies with the individual computer application functions into individual areas of a product design such as a mobile device.

Further, essentially any array of packages can be coupled, for example, a 2-, 4-, or 6-package combination can be molded together. Further still, there is no limitation to a rectangular array of combined packages as illustrated below in the discussion with respect to FIGS. 5 and 6, where square, rectangle and other configurations can be embodied such that the disclosed process is form factor agnostic. A socket may be designed to match the combined package form factor, with an interconnect layout interfacing between the socket connection points and the combined die package conductive interconnects. In some embodiments, if it is desired to have a CPU computer application function at the center of a socket and other applications on the periphery of the socket, and a socket can be so-designed. In another embodiment, a CPU computer application function can be at the top edge of the combined package with other dies on bottom and sides of the combined package, a socket design can be made for that configuration.

FIG. 2A illustrates pre-assembled packages being attached to a carrier wafer with an ultraviolet (UV) release film, according to some embodiments. FIG. 2A illustrates an initial process step to obtain the desired combined package that is first seen at FIG. 1B and discussed above. The dash lines indicate that more than two die packages could be processed, and that the process is not limited to two die packages. In the described process flow, a wafer carrier assembly process is implemented for compatibility with existing equipment in which a ultraviolet (UV) release film is used to enable picking. Prior to assembling onto the carrier wafer, standard assembly processes for package and die attach are used. FIG. 2A depicts the assembly of a package 101 with attached components PKG1, PKG2 onto carrier wafer 115 with a UV release film. Release materials are well known to those of ordinary skill in the art. Laser release materials obtained from multiple suppliers such as ShinEtsu Chemical Co. Ltd., Daixin Materials Corp., JSR Corp. (JSR), and Tokyo Ohka Kogyo America, Inc., among others, are available for this application, as are IR release materials from 3M and thermally activated materials from JSR and Nitto.

Figure 2B:
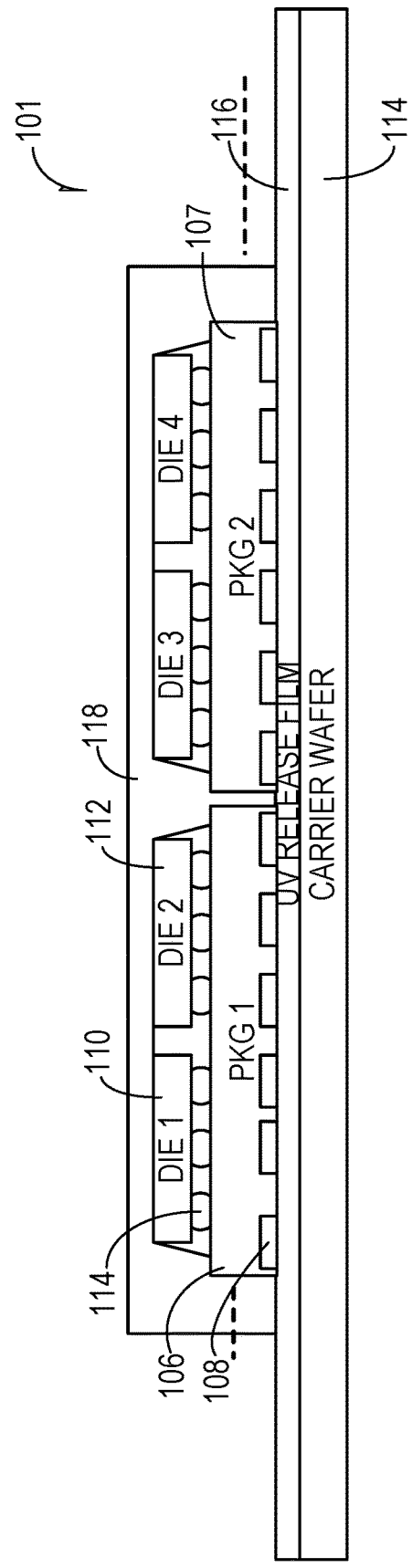
FIG. 2B illustrates an overmolding step applied after the attachment step of FIG. 2A, according to some embodiments.

FIG. 2B illustrates an overmolding step applied after the attachment step of FIG. 2A, according to some embodiments. Overmolding is used as mechanical support to hold the packages in place during processing, handling, and socketing, and provides an overmolded structure. Mold 118 surrounds PKG1 and PKG 2. A transfer mold chase can be used with a compression molding process, in some embodiments. In some embodiments the mold would be dispensed atop the packages, either as a liquid or as solid granules, and then the chase may be thermally pressed down while pulling a vacuum to eliminate voids. In other embodiments, the mold could be injected under pressure.

FIG. 3A illustrates a planarization step to planarize the mold and allow for die exposure for subsequent thermal considerations, according to some embodiments. This is sometimes called mold milling. The mold 118 may be ground off to bring the mold 118 flush with the back surface of the dies, such as Die 1-Die 4, as illustrated in FIG. 3A. Planarization processes are well known and include techniques such as polishing processes to remove material from the top of the mold, grinding, and blade processes that cut the material away in very small segments.

FIG. 3B illustrates a singulation step, sometimes called die-cutting or dicing, according to some embodiments. Singulation, in some embodiments, can be by saw blade, router or laser devices that cut into the material at the edges as illustrated in FIG. 3B.

Figure 4A:
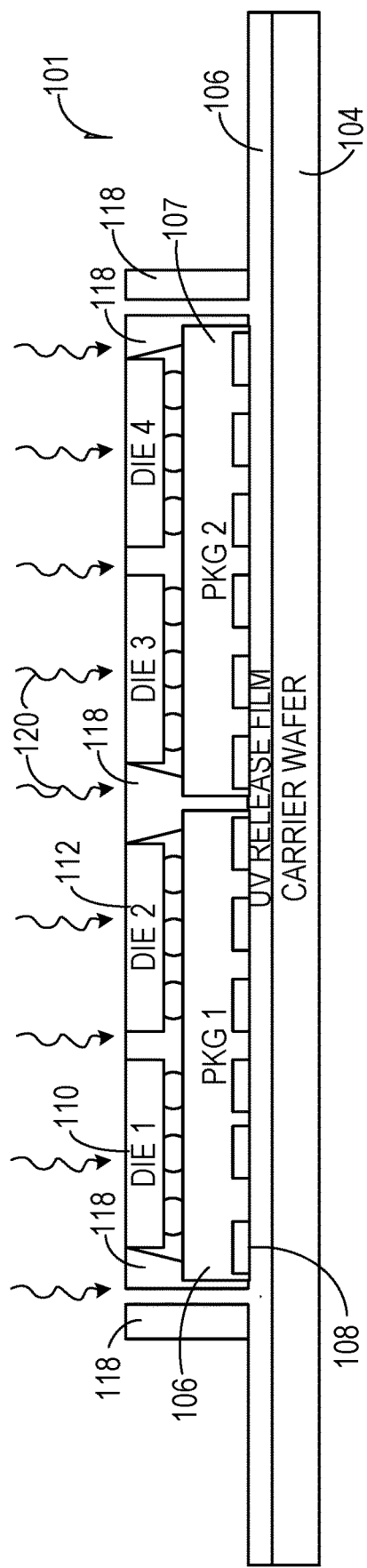
FIG. 4A illustrates irradiating the wafer with UV to active the UV release film, according to some embodiments.
Figure 4B:
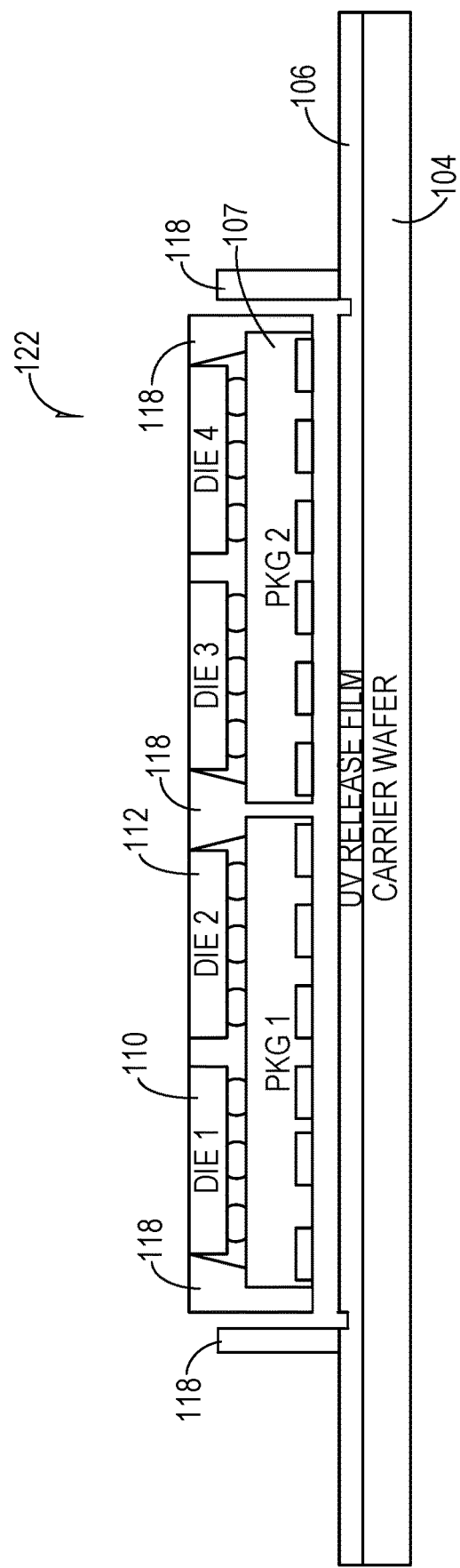
FIG. 4B illustrates the step of picking the multi-independent package unit, according to some embodiments.

FIG. 4A illustrates irradiating the wafer with UV energy 120 to active the UV release film, according to some embodiments. Activating the release film to allow for picking of the completed units for subsequent processing, such as lid attach. FIG. 4B illustrates the step of picking the multi-independent package unit 120, according to some embodiments. Typically a vacuum nozzle or suction cup array is used to pick the devices and move them to a tray. The multi-package units 120, which represent unit 101 of FIG. 1B can be placed into a single socket, or socketed, such as being placed into socket 102 of FIG. 1B.

Figure 5:
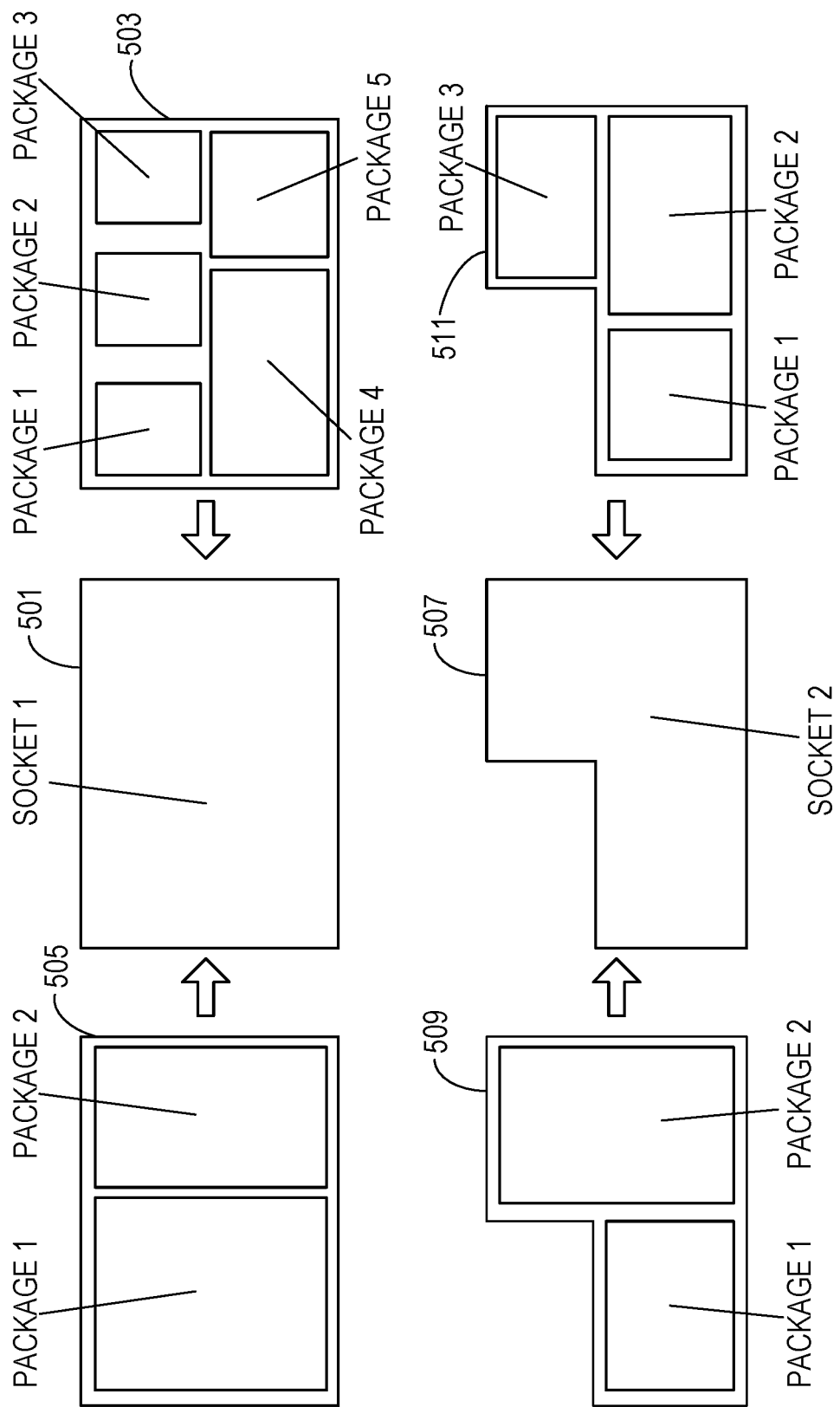
FIG. 5 illustrates two different sockets where each individual component die package can have a unique configuration and the combined multi-die package is customized for a specific socket, according to some embodiments.
Figure 6:
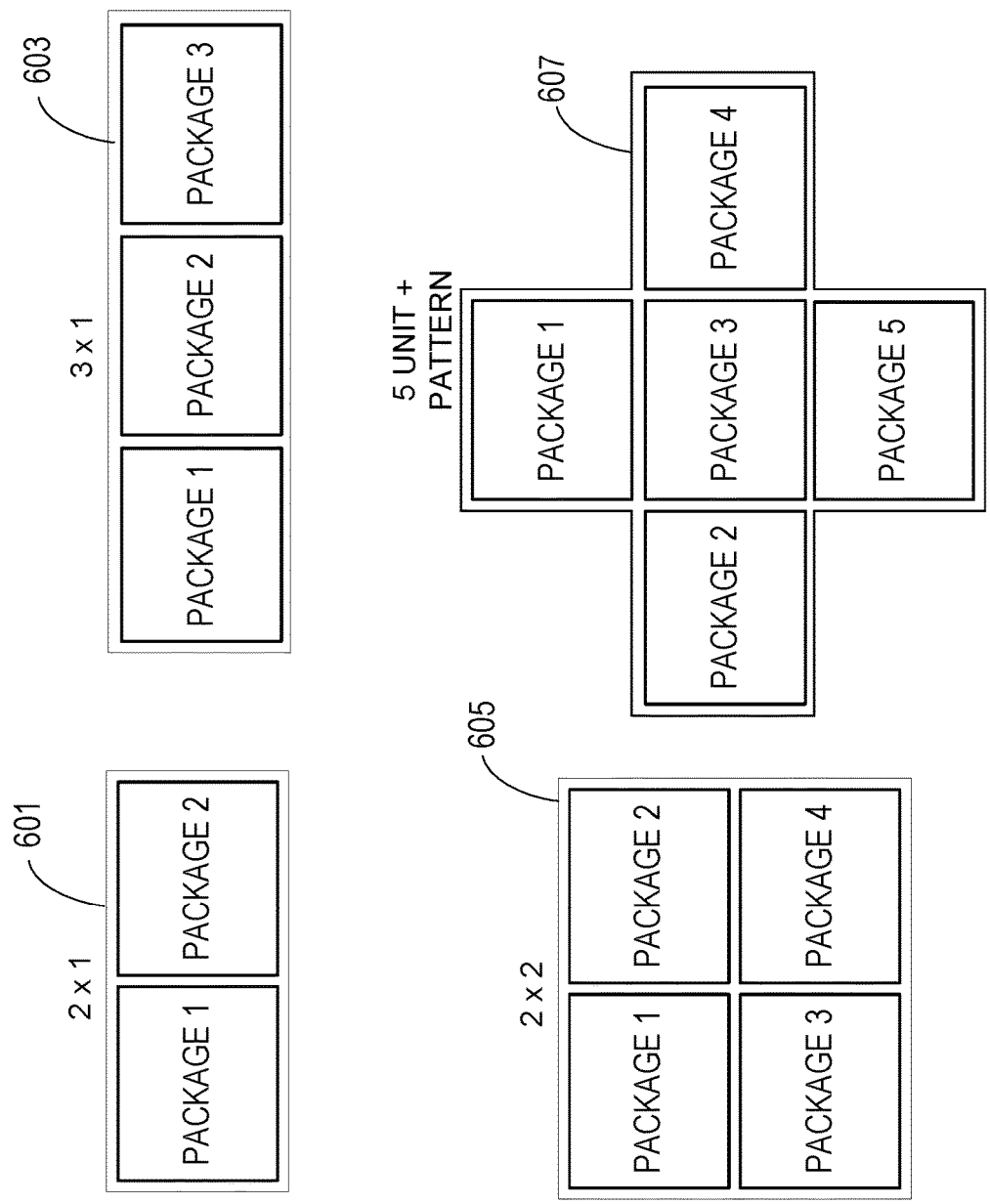
FIG. 6 illustrates a plurality of socket configurations where each of the component die packages are identical in size and the combined package accommodates a specific socket configuration, according to some embodiments.

As discussed above, the disclosed subject matter is not limited to two pairs of dies combined in a package. Any number of dies can be used, depending on the needs addressed by an embodiment. FIGS. 5 and 6 illustrate that neither the number of packages molded together, nor the dimensions of the packages, are limiting factors. For example, FIG. 5 illustrates two different sockets where each individual component die package in a specific socket can have a unique configuration and the combined package is customized for the socket, according to some embodiments. Two socket configurations 501, 507 are disclosed. Package configurations 505 and 503 represent two-package and five-package configurations, each of different package sizes, each combined group of packages 503 and 505 fitting into socket 501. Similarly, packages 509 and 511 represent two-package and three-package configurations, each of the packages in each combined group of a different size, each combined group of packages 509, 511 fitting into socket 507. As can be seen in FIG. 5, the molded multi-die packages are laid out in a geographical configuration with respect to each other. For example, in 505, package 1 and package 2 are laid out side-by-side with the two packages having two different physical dimensions. In 503, packages 1-5 are laid out in a geographical configuration on two levels, with side-by side packages 1-3 on one of the two levels and packages 4-5 on another of the two levels. In each case, socket 501 has been designed to meet the geographical configurations of the packages, including the package conductive interconnects matching the socket conductive connection points. At 509, package 1 and package 2 are laid out in a side-by-side geographical configuration with the two packages having two different physical dimensions, where the different physical dimensions are different dimensions than those illustrated as different at 505. At 511, packages 103 are laid out in a geographical configuration on two different levels with side-by-side packages 1-2 on one of the two levels and package 3 on another of the two levels. In each case, socket 507 has been designed to meet the geographical configurations of the packages, including the package conductive interconnects matching the socket conductive connection points. In each of the above-described configurations, each of the molded multi-die packages can be configured to perform the same or different computer application functions.

FIG. 6 illustrates a plurality of socket configurations where each of the component multi-die packages are identical in size and the combined molded multi-die packages are accommodated by a specific socket configuration. In FIG. 6, socket 601 is a 2×1 package socket, socket 603 is a 3×1 package, socket 605 is a 2×2 package socket and socket 507 is a 5-unit plus (+) pattern socket. Unlike the illustrated configurations of FIG. 5, each molded multi-die package in FIG. 6 is of the same size, and each combined group of molded multi-die packages fits into one of the exemplar sockets 501, 503, 505, and 507, including the conductive interconnects of the packages matching the conductive connection points of the socket. In each of the above-described configurations, each of the molded multi-die packages can be configured to perform the same or different computer application functions. Hence, as discussed above, many configurations can be implemented using the disclosed subject matter.

Figure 7:
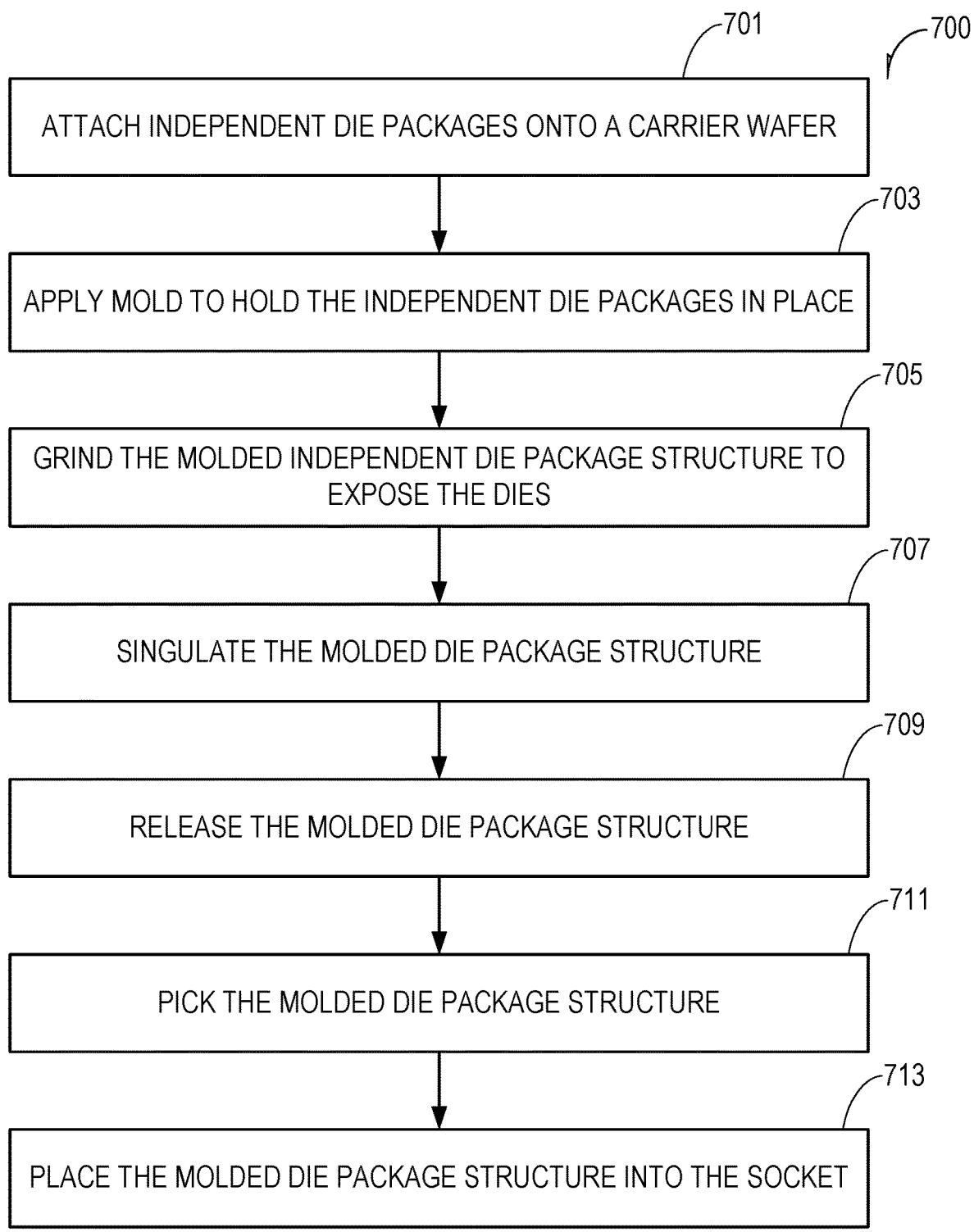
FIG. 7 is a flow chart that represents process flow, according to some embodiments.

FIG. 7 is a flow chart that represents process flow 700, according to some embodiments. At 701 the independent die packages are attached onto a carrier wafer with a release film which, in some embodiments, may be activated by ultraviolet light. At 703 the molded independent multi-die package structure is planarized to expose the dies. At 705 the molded independent multi-die package structure is planarized to expose the dies. The planarized, molded multi-die package is singulated at 707. At 711 the molded multi-die package structure is picked for further processing. At 714 the molded multi-die package structure is placed into the socket. While the disclosed subject matter has been described as molded multi-die packages placed into sockets, the disclosure is not limited to use of sockets. In some embodiments the molded multi-die packages can be configured to match conductive connection points on the mother board, the same way it can be configured to match conductive connection points in a socket.

Figure 8:
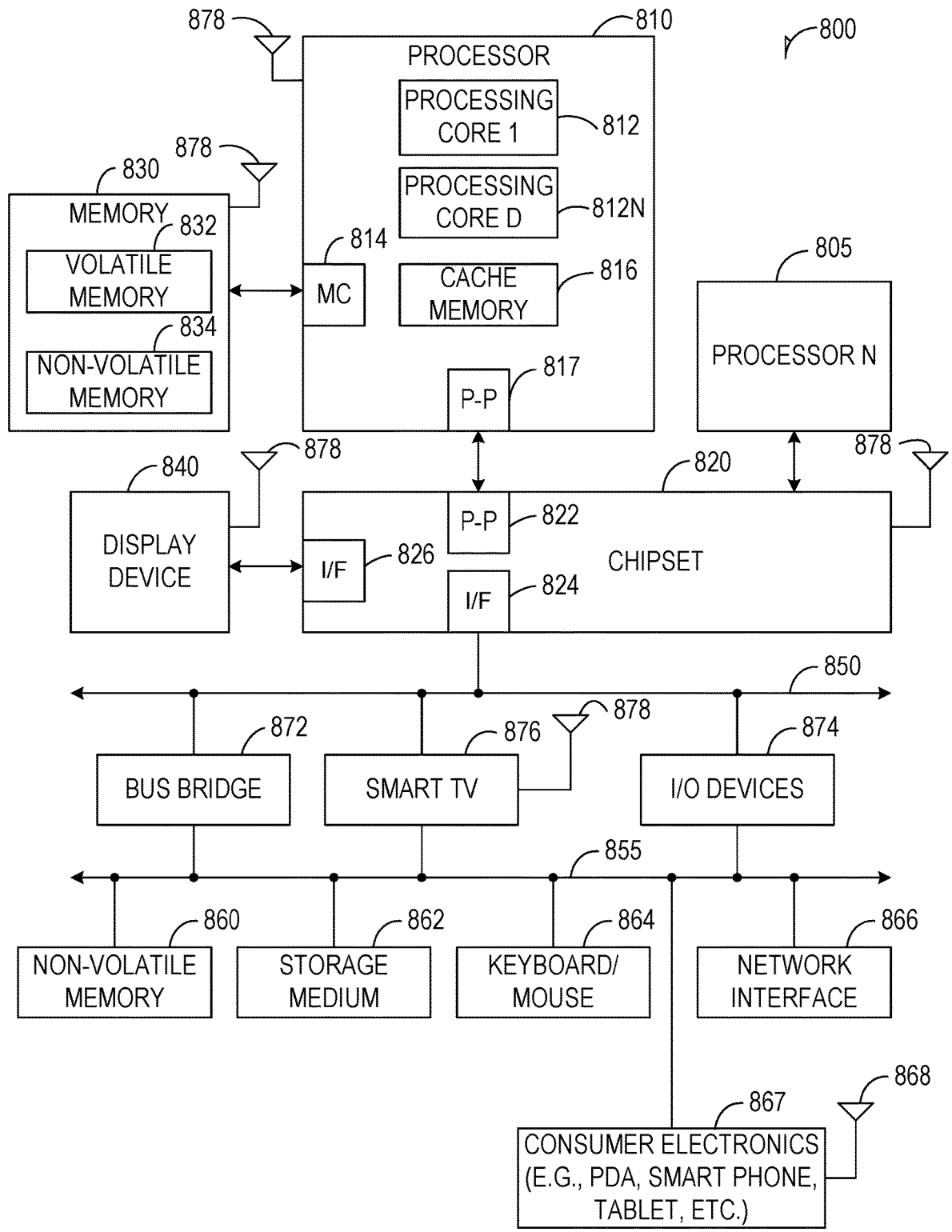
FIG. 8 illustrates an example machine, according to some embodiments.

FIG. 8 illustrates a system level diagram, depicting an example of an electronic device (e.g., system) including one or more integrated circuits that comprise multiple independent die packages combined and placed in a single socket, as described in the present disclosure. FIG. 8 is included to show an example of a higher level device application for integrated circuits employing phase and length matching using slow wave structures. In one embodiment, system 800 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 800 is a system on a chip (SOC) system.

In one embodiment, processor 810 has one or more processor cores 812 and 812N, where 812N represents the Nth processor core inside processor 810 where N is a positive integer. In one embodiment, system 800 includes multiple processors including 810 and 805, where processor 805 has logic similar or identical to the logic of processor 810. In some embodiments, processing core 812 includes, but is not limited to, pre-fetch logic to fetch instructions, decode logic to decode the instructions, execution logic to execute instructions and the like. In some embodiments, processor 810 has a cache memory 816 to cache instructions and/or data for system 800. Cache memory 816 may be organized into a hierarchal structure including one or more levels of cache memory.

In some embodiments, processor 810 includes a memory controller 814, which is operable to perform functions that enable the processor 810 to access and communicate with memory 830 that includes a volatile memory 832 and/or a non-volatile memory 834. In some embodiments, processor 810 is coupled with memory 830 and chipset 820. Processor 810 may also be coupled to a wireless antenna 878 to communicate with any device configured to transmit and/or receive wireless signals. In one embodiment, an interface for wireless antenna 878 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 832 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 834 includes, but is not limited to, flash memory, phase change memory (PCM), read-only memory (ROM), electrically erasable programmable read-only memory (EEPROM), or any other type of non-volatile memory device.

Memory 830 stores information and instructions to be executed by processor 810. In one embodiment, memory 830 may also store temporary variables or other intermediate information while processor 810 is executing instructions. In the illustrated embodiment, chipset 820 connects with processor 810 via Point-to-Point (PtP or P-P) interfaces 817 and 822. Chipset 820 enables processor 810 to connect to other elements in system 800. In some embodiments of the example system, interfaces 817 and 822 operate in accordance with a PtP communication protocol such as the Intel® QuickPath Interconnect (QPI) or the like. In other embodiments, a different interconnect may be used.

In some embodiments, chipset 820 is operable to communicate with processor 810, 805N, display device 840, and other devices, including a bus bridge 872, a smart TV 876, I/O devices 874, nonvolatile memory 860, a storage medium (such as one or more mass storage devices) 862, a keyboard/mouse 864, a network interface 866, and various forms of consumer electronics 877 (such as a PDA, smart phone, tablet etc.), etc. In one embodiment, chipset 820 couples with these devices through an interface 824. Chipset 820 may also be coupled to a wireless antenna 878 to communicate with any device configured to transmit and/or receive wireless signals.

Chip set 820 connects to display device 840 via interface 826. Display 840 may be, for example, a liquid crystal display (LCD), a plasma display, cathode ray tube (CRT) display, or any other form of visual display device. In some embodiments of the example system, processor 810 and chipset 820 are merged into a single SOC. In addition, chipset 820 connects to one or more buses 850 and 855 that interconnect various system elements, such as I/O devices 874, nonvolatile memory 860, storage medium 862, a keyboard/mouse 864, and network interface 866. Buses 850 and 855 may be interconnected together via a bus bridge 872.

In one embodiment, mass storage device 862 includes, but is not limited to, a solid state drive, a hard disk drive, a universal serial bus flash memory drive, or any other form of computer data storage medium. In one embodiment, network interface 866 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 8 are depicted as separate blocks within the system 800, the functions performed by some of these blocks may be integrated within a single semiconductor circuit or may be implemented using two or more separate integrated circuits. For example, although cache memory 816 is depicted as a separate block within processor 810, cache memory 816 (or selected embodiments of 816) can be incorporated into processor core 812.

EXAMPLES

Example 1 is a molded multi-die package configured for placement into a socket, comprising: a plurality of independent die packages, the plurality of independent packages spaced apart laterally and molded into a single molded multi-die package; and a plurality of conductive interconnects on the molded multi-die package, the plurality of conductive interconnects configured to match a plurality of conductive connection points in the socket.

In Example 2, the subject matter of Example 1 optionally includes wherein the conductive interconnects and the conductive connection points are connected by a ball grid array (BGA), by a land grid array (LGA) or by a pin grid array (PGA).

In Example 3, the subject matter of any one or more of Examples 1-2 optionally include wherein each independent die package of the molded multi-die package is configured to perform the same computer application function.

In Example 4, the subject matter of any one or more of Examples 1-3 optionally include wherein at least one of the independent die packages of the molded multi-die packages is configured to perform a different computer application function from that of another of the independent die packages of the molded multi-die package.

In Example 5, the subject matter of any one or more of Examples 1-4 optionally include wherein each independent die package of the molded multi-die package has the same mechanical dimensions.

In Example 6, the subject matter of any one or more of Examples 1-5 optionally include wherein at least one of the of the independent die packages of the molded multi-die package has different mechanical dimensions from another of the independent die packages of the molded multi-die package.

In Example 7, the subject matter of any one or more of Examples 4-6 optionally include wherein at least one of the of the independent die packages of the molded multi-die package has different mechanical dimensions from another of the independent die packages of the molded multi-die package, the independent die packages are arranged in a given geographical configuration, and the socket matches the geographical configuration of the independent die packages.

In Example 8, the subject matter of any one or more of Examples 4-7 optionally include wherein the independent die packages of the multi-die packages have the same mechanical dimensions, the independent die packages of the molded multi-die package are arranged in a given geographical configuration, and the socket matches the geographical configuration of the independent die packages.

In Example 9, the subject matter of any one or more of Examples 5-8 optionally include wherein at least one of the of the independent die packages of the molded multi-die package is configured to perform a different computer application function from another of the independent die packages of the molded multi-die package, the independent die packages are arranged in a given geographical configuration, and the socket matches the geographical configuration of the independent die packages.

In Example 10, the subject matter of any one or more of Examples 5-9 optionally include wherein the independent die packages of the molded multi-die package are configured to perform the same computer application function, the independent die packages are arranged in a given geographical configuration, and the socket matches the geographical configuration of the independent die packages.

Example 11 is a computer processor comprising: a computer socket; a plurality of independent die packages molded into a single molded multi-die package, the plurality of independent packages spaced apart laterally and held together by a mold material that fills a gap between the packages, wherein each of the independent die packages comprises one or more processor cores, memory, and a memory controller; a plurality of conductive interconnects on the molded multi-die package, the plurality of conductive interconnects configured to match a plurality of conductive connection points in the socket; and a connection grid that connects the plurality of conductive interconnects and the plurality of conductive connection points in the socket.

In Example 12, the subject matter of Example 11 optionally includes wherein the connection grid is a BGA, an LGA or a PGA.

In Example 13, the subject matter of any one or more of Examples 11-12 optionally include wherein each independent die package is configured to perform the same computer application function.

In Example 14, the subject matter of any one or more of Examples 11-13 optionally include wherein at least one of the independent die packages is configured to perform a different computer application function from that of another of the independent die packages.

In Example 15, the subject matter of any one or more of Examples 11-14 optionally include wherein at least one of the of the independent die packages has different mechanical dimensions from another of the independent die packages.

In Example 16, the subject matter of any one or more of Examples 13-15 optionally include wherein at least one of the of the independent die packages of the molded multi-die package has different mechanical dimensions from another of the independent die packages of the molded multi-die package, the independent die packages are arranged in a given geographical configuration, and the socket matches the geographical configuration of the independent die packages.

In Example 17, the subject matter of any one or more of Examples 13-16 optionally include wherein the independent die packages of the multi-die packages have the same mechanical dimensions, the independent die packages of the molded multi-die package are arranged in a given geographical configuration, and the socket matches the geographical configuration of the independent die packages.

In Example 18, the subject matter of any one or more of Examples 15-17 optionally include wherein at least one of the of the independent die packages of the molded multi-die package is configured to perform a different computer application function from another of the independent die packages of the molded multi-die package, the independent die packages are arranged in a given geographical configuration, and the socket matches the geographical configuration of the independent die packages.

In Example 19, the subject matter of any one or more of Examples 15-18 optionally include wherein the independent die packages of the molded multi-die package are configured to perform the same computer application function, the independent die packages are arranged in a given geographical configuration, and the socket matches the geographical configuration of the independent die packages.

In Example 20, the subject matter of any one or more of Examples 11-19 optionally include wherein the socket is configured in one of a plurality of configurations, the configurations comprising a rectangle, a square or a plus-sign pattern.

In Example 21, the subject matter of Example 20 optionally includes wherein the rectangle configuration includes two or three molded multi-die packages.

In Example 22, the subject matter of any one or more of Examples 20-21 optionally include wherein the square configuration includes four molded multi-die packages.

In Example 23, the subject matter of any one or more of Examples 20-22 optionally include wherein the plus-sign pattern configuration includes five molded multi-die packages.

Example 24 is a method of combining a plurality of independent die packages for socketing, comprising: attaching a plurality of independent die packages to a carrier wafer with a release film; overmolding the attached plurality of independent die packages to provide a molded multi-die package; planarizing the molded multi-die package to expose the dies; singulating the molded multi-die package; releasing the molded multi-die package from the carrier wafer; and picking the molded multi-die package for further processing.

In Example 25, the subject matter of Example 24 optionally includes the method further comprising placing the molded multi-die package in a single socket.

In Example 26, the subject matter of Example 25 optionally includes wherein each independent die package is configured to perform the same computer application function.

In Example 27, the subject matter of any one or more of Examples 25-26 optionally include wherein at least one of the independent die packages is configured to perform a different computer application function from that of another of the independent die packages.

In Example 28, the subject matter of any one or more of Examples 25-27 optionally include wherein at least one of the of the independent die packages has different mechanical dimensions from another of the independent die packages.

Example 29 is a molded multi-die package configured for electrical connection to a motherboard, comprising: a plurality of independent die packages, the plurality of independent packages spaced apart laterally and molded into a single molded multi-die package; and a plurality of conductive interconnects on the molded multi-die package, the plurality of conductive interconnects configured to match a plurality of conductive connection points on the motherboard.

In Example 30, the subject matter of Example 1 optionally includes wherein the conductive interconnects and the conductive connection points are connected by a ball grid array (BGA), by a land grid array (LGA) or by a pin grid array (PGA).

In Example 31, the subject matter of any one or more of Examples 1-2 optionally include wherein each independent die package of the molded multi-die package is configured to perform the same computer application function.

In Example 32, the subject matter of any one or more of Examples 1-3 optionally include wherein at least one of the independent die packages of the molded multi-die packages is configured to perform a different computer application function from that of another of the independent die packages of the molded multi-die package.

In Example 33, the subject matter can include, or can optionally be combined with any portion or combination of, any portions of any one or more of Examples 1 through 32 to include, subject matter that can include means for performing any one or more of the functions of Examples 1 through 32, or a machine-readable medium including instructions that, when performed by a machine, cause the machine to perform any one or more of the functions of Examples 1 through 32.

All features of the apparatuses described above (including optional features) may also be implemented with respect to the methods or processes described herein.

Examples, as described herein, may include, or may operate on, logic or a number of components, modules, or mechanisms. Modules are tangible entities (e.g., hardware) capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a machine readable medium. In an example, the software, when executed by the underlying hardware of the module, causes the hardware to perform the specified operations.

Accordingly, the term "module" is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software, the general-purpose hardware processor may be configured as respective different modules at different times. Software may accordingly configure a hardware processor, for example, to constitute a particular module at one instance of time and to constitute a different module at a different instance of time.

What is claimed is:

1. A molded multi-die package configured for placement into a socket, comprising:
    a plurality of independent die packages, the plurality of independent packages spaced apart laterally and molded with a mold material into a single molded multi-die package, wherein:
        the plurality of independent die packages include a first die package and a second die package;
        a gap spaces the first die package apart from the second die package, and the gap extends between a first side of the molded multi-die package and a second side of the molded multi-die package; and
        the mold material is located in the gap between the first die package and the second die package, and the mold material is continuous between the first side of the molded multi-die package and the second side of the molded multi-die package; and
    a plurality of conductive interconnects included on the first side of the molded multi-die package, the plurality of conductive interconnects configured to match a plurality of conductive connection points in the socket.

2. The molded multi-die package of claim 1 wherein the conductive interconnects and the conductive connection points are connected by a ball grid array (BGA), by a land grid array (LGA) or by a pin grid array (PGA).

3. The molded multi-die package of claim 1 wherein each independent die package of the molded multi-die package is configured to perform the same computer application function.

4. The molded multi-die package of claim 1 wherein at least one of the independent die packages of the molded multi-die packages is configured to perform a different computer application function from that of another of the independent die packages of the molded multi-die package.

5. The molded multi-die package of claim 1 wherein each independent die package of the molded multi-die package has the same mechanical dimensions.

6. The molded multi-die package of claim 1 wherein at least one of the of the independent die packages of the molded multi-die package has different mechanical dimensions from another of the independent die packages of the molded multi-die package.

7. The molded multi-die package of claim 4 wherein at least one of the of the independent die packages of the molded multi-die package has different mechanical dimensions from another of the independent die packages of the molded multi-die package, the independent die packages are arranged in a given geographical configuration, and the socket matches the geographical configuration of the independent die packages.

8. The molded multi-die package of claim 4 wherein the independent die packages of the multi-die packages have the same mechanical dimensions, the independent die packages of the molded multi-die package are arranged in a given geographical configuration, and the socket matches the geographical configuration of the independent die packages.

9. The molded multi-die package of claim 5 wherein at least one of the of the independent die packages of the molded multi-die package is configured to perform a different computer application function from another of the independent die packages of the molded multi-die package, the independent die packages are arranged in a given geographical configuration, and the socket matches the geographical configuration of the independent die packages.

10. The molded multi-die package of claim 5 wherein the independent die packages of the molded multi-die package are configured to perform the same computer application function, the independent die packages are arranged in a given geographical configuration, and the socket matches the geographical configuration of the independent die packages.

11. A computer processor comprising:
    a computer socket;
    a plurality of independent die packages molded into a single molded multi-die package, the plurality of independent packages including a first die package and a second die package spaced apart laterally and held together by a mold material that fills a gap between the first die package and the second die package, wherein:
        the gap extends between a first side of the molded multi-die package and a second side of the molded multi-die package;
        the mold material is located in the gap and is continuous between the first side of the molded multi-die package and the second side of the molded multi-die package; and
        each of the independent die packages comprises one or more processor cores, memory, and a memory controller;
    a plurality of conductive interconnects included on the first side of the molded multi-die package, the plurality of conductive interconnects configured to match a plurality of conductive connection points in the socket; and
    a connection grid that connects the plurality of conductive interconnects and the plurality of conductive connection points in the socket.

12. The computer processor of claim 11 wherein the connection grid is a BGA, an LGA or a PGA.

13. The computer processor of claim 11 wherein each independent die package is configured to perform the same computer application function.

14. The computer processor of claim 11 wherein at least one of the independent die packages is configured to perform a different computer application function from that of another of the independent die packages.

15. The computer processor of claim 11 wherein at least one of the of the independent die packages has different mechanical dimensions from another of the independent die packages.

16. The computer processor of claim 13 wherein at least one of the of the independent die packages of the molded multi-die package has different mechanical dimensions from another of the independent die packages of the molded multi-die package, the independent die packages are arranged in a given geographical configuration, and the socket matches the geographical configuration of the independent die packages.

17. The computer processor of claim 13 wherein the independent die packages of the multi-die packages have the same mechanical dimensions, the independent die packages of the molded multi-die package are arranged in a given geographical configuration, and the socket matches the geographical configuration of the independent die packages.

18. The computer processor of claim 15 wherein at least one of the of the independent die packages of the molded multi-die package is configured to perform a different computer application function from another of the independent die packages of the molded multi-die package, the independent die packages are arranged in a given geographical configuration, and the socket matches the geographical configuration of the independent die packages.

19. The computer processor of claim 15 wherein the independent die packages of the molded multi-die package are configured to perform the same computer application function, the independent die packages are arranged in a given geographical configuration, and the socket matches the geographical configuration of the independent die packages.

20. The computer system of claim 11 wherein the socket is configured in one of a plurality of configurations, the configurations comprising a rectangle, a square or a plus-sign pattern.

21. The computer system of claim 20 wherein the rectangle configuration includes two or three molded multi-die packages.

22. The computer system of claim 20 wherein the square configuration includes four molded multi-die packages.

23. The computer system of claim 20 wherein the plus-sign pattern configuration includes five molded multi-die packages.

24. A molded multi-die package configured for electrical connection to a motherboard, comprising:
 a plurality of independent die packages, the plurality of independent packages spaced apart laterally and molded with a mold material into a single molded multi-die package, wherein:
  the plurality of independent die packages include a first die package and a second die package;
  a gap spaces the first die package apart from the second die package, and the gap extends between a first side of the molded multi-die package and a second side of the molded multi-die package; and
  a mold material is located in the gap between the first die package and the second die package, wherein the mold material is continuous between the first side of the molded multi-die package and the second side of the molded multi-die package; and
 a plurality of conductive interconnects on the molded multi-die package, the plurality of conductive interconnects configured to match a plurality of conductive connection points on the motherboard.

25. The molded multi-die package of claim 24 wherein the conductive interconnects and the conductive connection points are connected by a ball grid array (BGA), by a land grid array (LGA) or by a pin grid array (PGA).

26. The molded multi-die package of claim 24 wherein each independent die package of the molded multi-die package is configured to perform the same computer application function.

27. The molded multi-die package of claim 24 wherein at least one of the independent die packages of the molded multi-die packages is configured to perform a different computer application function from that of another of the independent die packages of the molded multi-die package.

* * * * *